(12) United States Patent  
Takeuchi

(10) Patent No.: US 9,503,051 B2  
(45) Date of Patent: Nov. 22, 2016

(54) HIGH-FREQUENCY MODULE HAVING A MATCHING ELEMENT COUPLED TO A CONNECTION UNIT

(71) Applicant: Murata Manufacturing Co., Ltd., Nagaokakyo-shi, Kyoto-fu (JP)

(72) Inventor: Morio Takeuchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/878,078

(22) Filed: Oct. 8, 2015

(65) Prior Publication Data

US 2016/0028364 A1 Jan. 28, 2016

Related U.S. Application Data

(63) Continuation of application No. PCT/JP2014/060247, filed on Apr. 9, 2014.

(30) Foreign Application Priority Data

Apr. 11, 2013 (JP) .................................. 2013-083079

(51) Int. Cl.
*H03H 9/64* (2006.01)
*H03H 9/72* (2006.01)
*H03H 9/60* (2006.01)
*H03H 9/52* (2006.01)
*H03H 9/00* (2006.01)

(52) U.S. Cl.
CPC ........... *H03H 9/725* (2013.01); *H03H 9/0009* (2013.01); *H03H 9/52* (2013.01); *H03H 9/605* (2013.01);
(Continued)

(58) Field of Classification Search
CPC .. H03H 9/6433; H03H 9/6479; H03H 9/725; H03H 9/0009; H03H 9/0057; H03H 9/605; H03H 9/6483; H03H 9/52; H03H 9/6489; H03H 9/6423
USPC .................. 333/133, 193–196, 187
See application file for complete search history.

(56) References Cited

U.S. PATENT DOCUMENTS 7,230,512 B1 * 6/2007 Carpenter ................ H03H 3/08
                                                  333/133
7,808,935 B2 * 10/2010 Koga ...................... H01P 1/213
                                                  333/132

(Continued)

FOREIGN PATENT DOCUMENTS

JP    2004-080233 A    3/2004
JP    2008-118192 A    5/2008

(Continued)

OTHER PUBLICATIONS

Official Communication issued in International Patent Application No. PCT/JP2014/060247, mailed on Jun. 17, 2014.

*Primary Examiner* — Barbara Summons
*Assistant Examiner* — Jorge Salazar, Jr.
(74) *Attorney, Agent, or Firm* — Keating & Bennett, LLP

(57) ABSTRACT

A filter unit of a high-frequency module includes SAW resonators connected in series with first and second series connection terminals therebetween, first and second shunt connection terminals, and additional SAW resonators. One end of one SAW resonator is connected to a connection node of other SAW resonators via a connection conductor, and the other end of the one SAW resonator is connected to the first shunt connection terminal via a connection conductor. The first shunt connection terminal is connected to ground via an inductor. A matching element is connected between the second series connection terminal and the second external connection terminal. The matching element is inductively coupled or capacitively coupled to the connection conductor.

19 Claims, 9 Drawing Sheets

(52) U.S. Cl.
CPC ............ *H03H 9/64* (2013.01); *H03H 9/6423* (2013.01); *H03H 9/6433* (2013.01); *H03H 9/6479* (2013.01); *H03H 9/6483* (2013.01); *H03H 9/6489* (2013.01); *H03H 9/0057* (2013.01)

(56) References Cited

U.S. PATENT DOCUMENTS

| | | | | |
|---|---|---|---|---|
| 7,978,019 | B2* | 7/2011 | Wiesbauer | H01P 1/213 333/12 |
| 8,138,854 | B2* | 3/2012 | Hara | H03H 9/0028 333/126 |
| 2003/0058066 | A1* | 3/2003 | Taniguchi | H03H 9/0557 333/193 |
| 2004/0227585 | A1 | 11/2004 | Taniguchi et al. | |
| 2009/0058555 | A1 | 3/2009 | Takata et al. | |
| 2012/0119847 | A1 | 5/2012 | Iwaki et al. | |
| 2014/0118084 | A1 | 5/2014 | Takemura | |

FOREIGN PATENT DOCUMENTS

| | | |
|---|---|---|
| JP | 2008-245310 A | 10/2008 |
| JP | 2009-290606 A | 12/2009 |
| JP | 2012-109818 A | 6/2012 |
| WO | 2007/145049 A1 | 12/2007 |
| WO | 2011/089746 A1 | 7/2011 |
| WO | 2013/008435 A1 | 1/2013 |

* cited by examiner

◄------►:INDUCTIVE COUPLING

◄------►:INDUCTIVE COUPLING

HIGH-FREQUENCY MODULE HAVING A MATCHING ELEMENT COUPLED TO A CONNECTION UNIT

BACKGROUND OF THE INVENTION

1. Field of the Invention

The present invention relates to a high-frequency module including a plurality of filter elements.

2. Description of the Related Art

Mobile devices and the like having a wireless communication function include a filter circuit to transmit only high-frequency signals having a desired frequency and to attenuate high-frequency signals having frequencies other than the desired frequency.

For example, Japanese Unexamined Patent Application Publication No. 2012-109818 describes a filter circuit including a plurality of SAW filters. Specifically, the filter circuit in Japanese Unexamined Patent Application Publication No. 2012-109818 has an input terminal and an output terminal between which a plurality of SAW filters are connected in series with each other. Respective SAW filters are also connected between a connection path that connects the series connected SAW filters to each other and ground.

In the filter circuit described in Japanese Unexamined Patent Application Publication No. 2012-109818, an inductor or a series circuit including an inductor and a capacitor (referred to as a correction circuit) is connected in parallel or substantially parallel to the series circuit of SAW filters in order to improve attenuation characteristics outside a pass band. In this case, the correction circuit is adjusted so that a high-frequency signal (a signal to be suppressed) outside the pass band which propagates through a circuit unit composed of SAW filters and a signal to be suppressed which propagates through the correction circuit have the same amplitude and opposite phases. Thus, the signals to be suppressed are canceled at a connection node between the circuit unit composed of SAW filters and the correction circuit, and are not output from the output terminal.

However, the configuration described above requires a correction circuit composed of an inductor or a series circuit including an inductor and a capacitor, separately from a main circuit unit composed of SAW filters having a filter function, only in order to improve attenuation characteristics.

Accordingly, the filter circuit has a large number of components, resulting in an increase in the size of the filter circuit, which is not suitable for current mobile terminals and the like where compactness is required.

SUMMARY OF THE INVENTION

Preferred embodiments of the present invention provide a high-frequency module including a compact filter circuit that is excellent in attenuation characteristics outside a pass band.

A preferred embodiment of the present invention relates to a high-frequency module including a first external connection terminal, a second external connection terminal, a filter unit connected between the first external connection terminal and the second external connection terminal, and a matching element connected between at least one of the first external connection terminal or the second external connection terminal and the filter unit, and including the following features.

A filter unit according to a preferred embodiment of the present invention includes a first series connection terminal that connects to the first external connection terminal, a second series connection terminal that connects to the second external connection terminal, and a shunt connection terminal that connects to ground. The filter unit includes a plurality of series-connected filter elements connected in series with each other between the first series connection terminal and the second series connection terminal. The filter unit includes a shunt-connected filter element including one end connected to a connection node of adjacent filter elements among the plurality of series-connected filter elements, and another end connected to the shunt connection terminal. The matching element is inductively coupled or capacitively coupled to a connection unit that connects to the shunt-connected filter element.

In this configuration, a sub-propagation path that extends through a path of inductive coupling or capacitive coupling produced by a connection unit located at a midway position in the filter unit and a matching element is separate from a main propagation path along which a high-frequency signal propagates through a plurality of filter units. The sub-propagation path has amplitude characteristics and phase characteristics different from those of the main propagation path in accordance with a degree of inductive coupling or capacitive coupling. By adjusting the amplitude characteristics and phase characteristics of the sub-propagation path, the transmission characteristics of the high-frequency module are able to be adjusted. Accordingly, the transmission characteristics of the high-frequency module are able to be adjusted without using any additional inductor or capacitor, and, for example, attenuation characteristics are improved.

In addition, a high-frequency module according to a preferred embodiment of the present invention may have the following configuration. The filter unit includes a plurality of shunt connection terminals, and at least one shunt-connected filter element is connected for each of the shunt connection terminals. The matching element is inductively coupled or capacitively coupled to at least one of connection units that connect to the plurality of shunt-connected filter elements.

This configuration provides a configuration in which the filter unit includes a plurality of shunt-connected filter elements. In this way, coupling at least one connection unit and a matching element to each other adjusts the transmission characteristics of the high-frequency module. Since a connection unit to be appropriately coupled is selected from among a plurality of connection units, the range over which the transmission characteristics are adjusted is extended further, enabling more desired attenuation characteristics to be achieved.

In addition, a high-frequency module according to a preferred embodiment of the present invention preferably has the following configuration. The connection unit and the matching element are inductively coupled or capacitively coupled to each other so that an impedance outside a pass band of the filter unit changes.

As provided in this configuration, appropriately adjusting the method of coupling and the degree of coupling causes characteristics outside the passband, or attenuation characteristics, to be changed without any change in the characteristics of the pass band.

Further, a high-frequency module according to a preferred embodiment of the present invention preferably has the following configuration. The connection unit and the matching element are inductively coupled or capacitively coupled to each other so that an attenuation pole frequency outside the pass band of the filter unit changes.

In this configuration, as the method of adjustment of the attenuation characteristics, the attenuation pole frequency is adjusted.

In a high-frequency module according to a preferred embodiment of the present invention, furthermore, the matching element may be a series-connected matching element that is connected in series between the first external connection terminal and the first series connection terminal or that is connected in series between the second external connection terminal and the second series connection terminal.

In a high-frequency module according to a preferred embodiment of the present invention, furthermore, the matching element may be a shunt-connected matching element that is connected between a connection path which connects the first external connection terminal and the first series connection terminal to each other and ground or that is connected between a connection path which connects the second external connection terminal and the second series connection terminal to each other and ground.

The configurations described above provide specific connection methods of the matching element. By appropriately determining any of these connection methods, it is possible to also appropriately adjust the attenuation characteristics described above while performing appropriate impedance matching between the filter unit and an external unit.

In a high-frequency module according to a preferred embodiment of the present invention, furthermore, the connection unit preferably includes a linear conductive pattern.

In this configuration, the connection unit is implemented with a simple structure, and the filter unit and the high-frequency module are made compact.

In addition, a high-frequency module according to a preferred embodiment of the present invention may further include a third terminal and a second filter unit, and the second filter unit may be connected between a connection path which connects the first series connection terminal to a filter element to be connected to the first series connection terminal and the third terminal.

This configuration provides a composite duplexer (such as a duplexer) including the first terminal as a common terminal and the second terminal and the third terminal as individual terminals.

In addition, a high-frequency module according to a preferred embodiment of the present invention may have the following configuration. The high-frequency module further includes a flat-plate-shaped filter substrate including a first principal surface on which an IDT electrode of the filter unit and the connection unit are provided, a flat-plate-shaped cover layer that faces the first principal surface of the filter substrate with a space between the cover layer and the first principal surface of the filter substrate, a connection electrode having a shape that projects from the first principal surface and extends through the cover layer, and a multi-layer substrate having the matching element mounted thereon or formed therein. The filter substrate is located so that the first principal surface is oriented toward a mounting surface of the multi-layer substrate. The filter substrate is connected to the multi-layer substrate via the connection electrode.

In this configuration, a high-frequency module is able to be implemented using a WLP (Wafer Level Package) filter unit and a multi-layer substrate. Thus, the high-frequency module is compact.

In addition, a high-frequency module according to a preferred embodiment of the present invention may have the following configuration. The matching element is a mount-type element to be mounted on the mounting surface of the multi-layer substrate. The connection unit is located on the first principal surface of the filter substrate near a first side of the filter substrate. The mount-type element is mounted near the first side of the filter substrate.

This configuration provides a specific example configuration of a high-frequency module that uses WLP in a case where the matching element is a mount-type element. The configuration described above ensures that coupling of the matching element and a connection unit is achieved.

Further, a high-frequency module according to a preferred embodiment of the present invention preferably has the following configuration. The matching element includes a rectangular or substantially rectangular parallel or substantially parallelepiped housing, and a spiral conductor provided in the housing and having a rectangular or substantially rectangular outer peripheral shape in plan view. The matching element is located so that a long side of the housing is parallel or substantially parallel to the first side of the filter substrate.

This configuration facilitates the coupling between the matching element and a connection unit, and makes it easy to adjust the amount of coupling to the desired value.

In addition, a high-frequency module according to a preferred embodiment of the present invention may have the following configuration. The matching element includes a conductive pattern provided on the mounting surface of the multi-layer substrate or a conductive pattern provided in the multi-layer substrate, and the conductive pattern and the connection unit at least partially overlap each other in plan view.

This configuration provides a specific example configuration of a high-frequency module that uses WLP in a case where the matching element includes a conductive pattern provided on the multi-layer substrate. The configuration described above ensures that coupling of the matching element and a connection unit is achieved. In addition, since the matching element is not configured to be mounted on the multi-layer substrate as a mount-type circuit element, a planar space for mounting the matching element is not required, which results in a reduction in the shape of the high-frequency module in plan view.

In addition, a high-frequency module according to a preferred embodiment of the present invention may have the following configuration. The high-frequency module further includes a flat-plate-shaped filter substrate including a first principal surface on which an IDT electrode of the filter unit and the connection unit are provided, and a flat-plate-shaped filter-mounting substrate located on the first principal surface side of the filter substrate, to which the first principal surface of the filter substrate is mounted. The matching element is provided on the filter-mounting substrate.

This configuration provides a case where the high-frequency module is implemented by CSP (Chip Sized Package).

According to various preferred embodiments of the present invention, a high-frequency module including a compact filter circuit that is excellent in attenuation characteristics outside a pass band is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
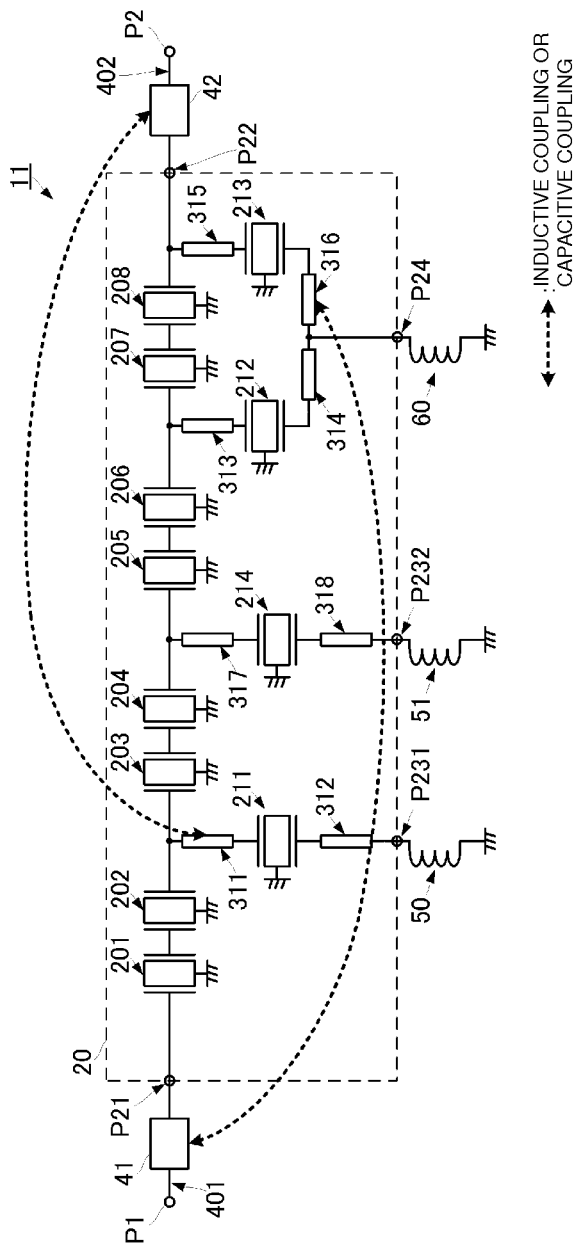
FIG. 1 is a circuit block diagram illustrating a first example circuit of a high-frequency module according to a preferred embodiment of the present invention.
Figure 2:
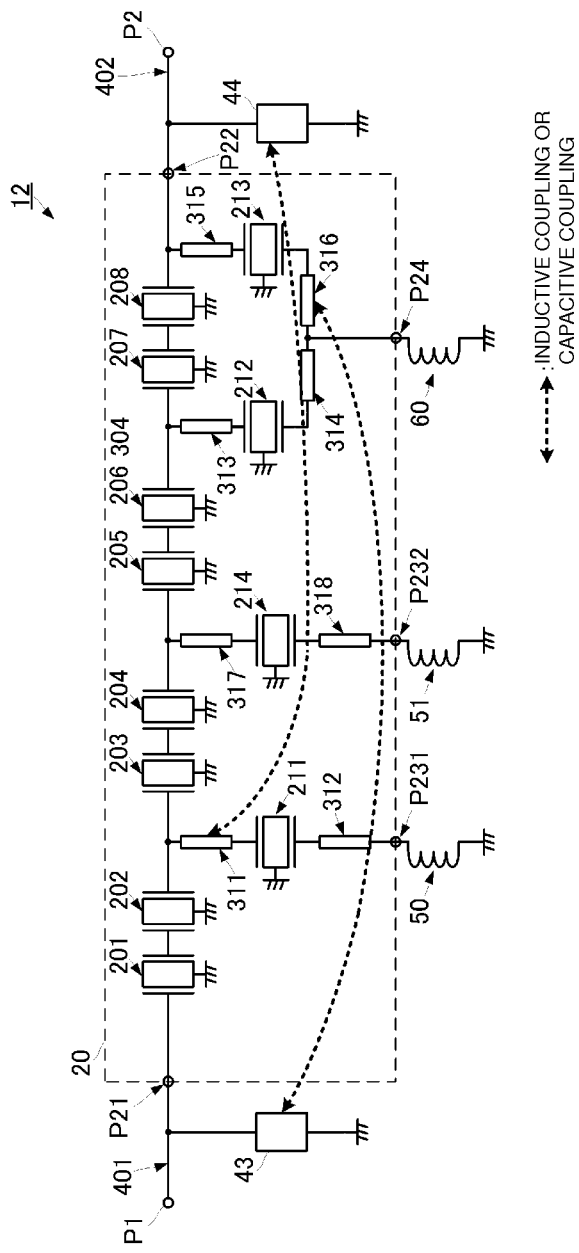
FIG. 2 is a circuit block diagram illustrating a second example circuit of a high-frequency module according to a preferred embodiment of the present invention.
Figure 3:
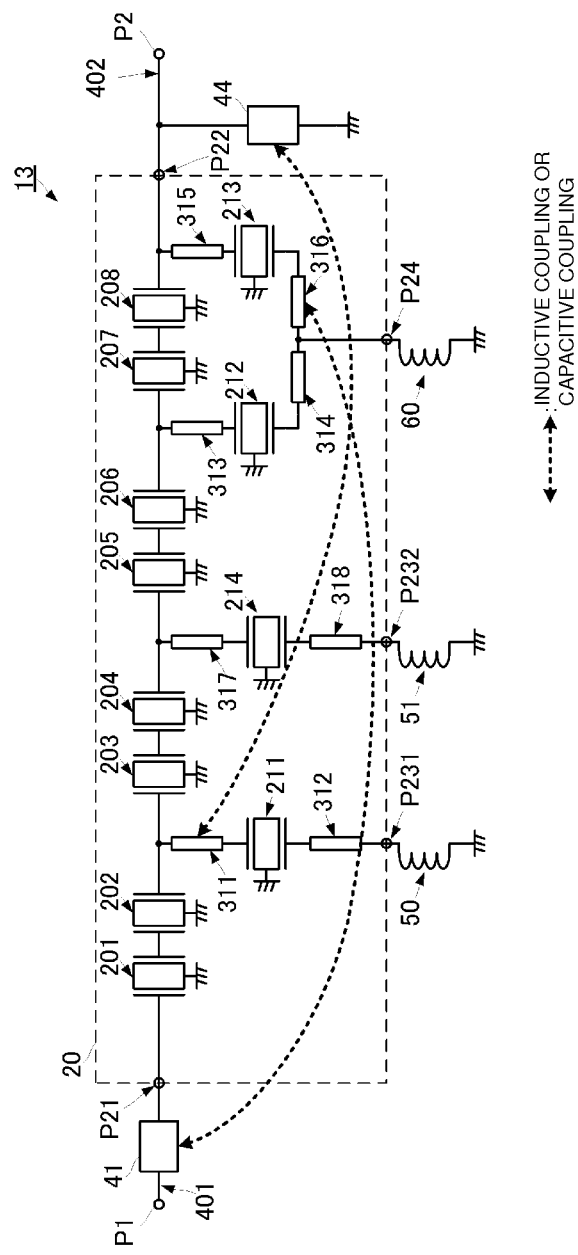
FIG. 3 is a circuit block diagram illustrating a third example circuit of a high-frequency module according to a preferred embodiment of the present invention.
Figure 4:
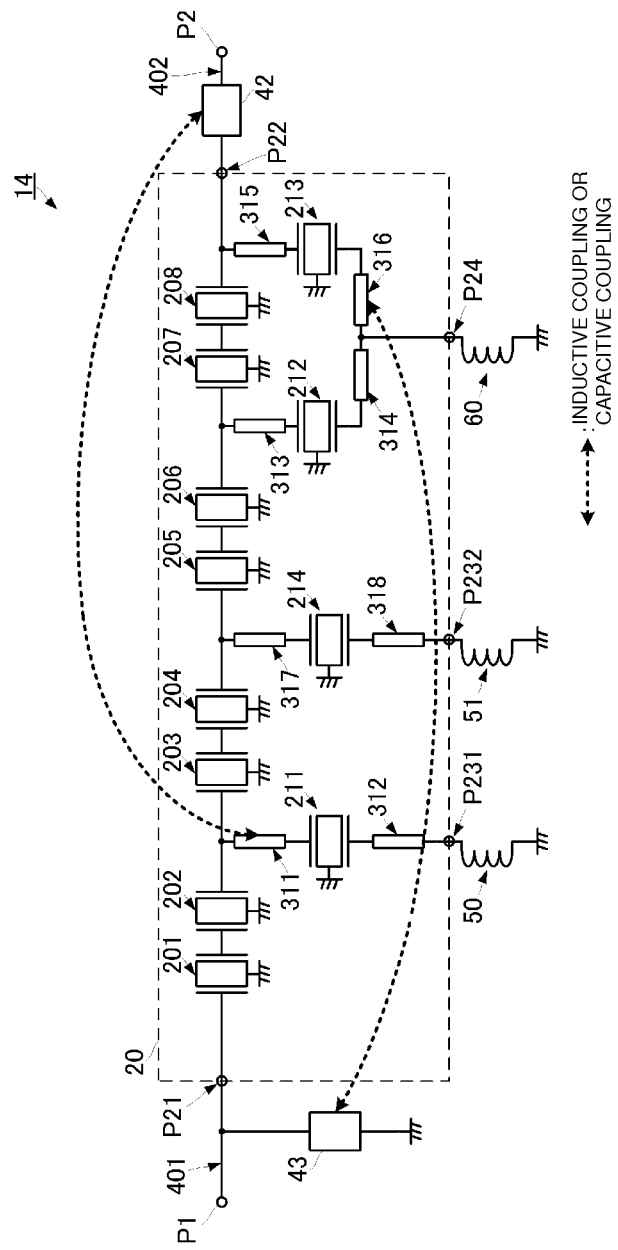
FIG. 4 is a circuit block diagram illustrating a fourth example circuit of a high-frequency module according to a preferred embodiment of the present invention.
Figure 5A:
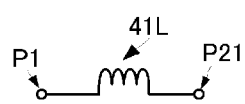
FIGS. 5A-5H illustrate circuit diagrams depicting specific examples of a matching element of the high-frequency modules illustrated in FIG. 1 to FIG. 4.
Figure 5E:
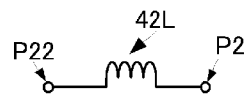
Figure 5B:
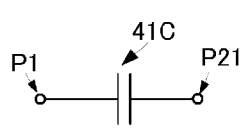
Figure 5F:
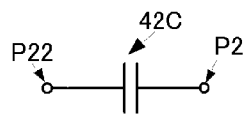
Figure 5C:
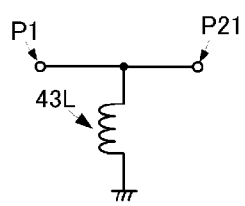
Figure 5G:
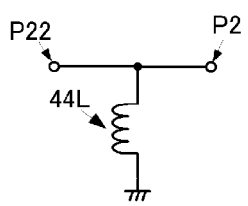
Figure 5D:
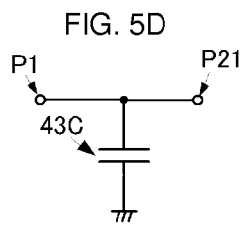
Figure 5H:
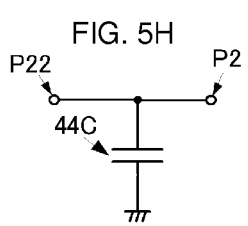

A high-frequency module according to a preferred embodiment of the present invention will be described with reference to the drawings. FIG. 1 is a circuit block diagram illustrating a first example circuit of a high-frequency module according to a preferred embodiment of the present invention. FIG. 2 is a circuit block diagram illustrating a second example circuit of a high-frequency module according to a preferred embodiment of the present invention. FIG. 3 is a circuit block diagram illustrating a third example circuit of a high-frequency module according to a preferred embodiment of the present invention. FIG. 4 is a circuit block diagram illustrating a fourth example circuit of a high-frequency module according to a preferred embodiment of the present invention. In FIG. 1 to FIG. 4, typical examples of inductive coupling or capacitive coupling are illustrated for ease of understanding of the drawings. FIG. 5A, FIG. 5B, FIG. 5C, and FIG. 5D are circuit diagrams illustrating specific examples of a matching element on the first external connection terminal side. FIG. 5E, FIG. 5F, FIG. 5G, and FIG. 5H are circuit diagrams illustrating specific examples of a matching element on the second external connection terminal side.

First, a common circuit configuration of high-frequency modules 11, 12, 13, and 14 illustrated in FIG. 1 to FIG. 4, respectively, will be described.

The high-frequency modules 11, 12, 13, and 14 each include a first external connection terminal P1, a second external connection terminal P2, and a filter unit 20. The filter unit 20 is connected between the first external connection terminal P1 and the second external connection terminal P2.

The filter unit 20 includes a first series connection terminal P21, a second series connection terminal P22, first shunt connection terminals P231 and P232, and a second shunt connection terminal P24. The first series connection terminal P21 is connected to the first external connection terminal P1 with a series-connected matching element or shunt-connected matching element described below interposed therebetween. The second series connection terminal P22 is connected to the second external connection terminal P2 with a series-connected matching element or shunt-connected matching element described below interposed therebetween.

The first shunt connection terminal P231 is connected to ground via an inductor for connection to ground 50. The first shunt connection terminal P232 is connected to ground via an inductor for connection to ground 51. The second shunt connection terminal P24 is connected to ground via an inductor for connection to ground 60.

The filter unit 20 includes a plurality of SAW resonators 201, 202, 203, 204, 205, 206, 207, and 208 (hereinafter referred to simply as the plurality of SAW resonators 201-208 in order to collectively describe a plurality of SAW resonators). These SAW resonators correspond to "series-connected filter elements". The filter unit 20 includes a plurality of SAW resonators 211, 212, 213, and 214. These SAW resonators correspond to "shunt-connected filter elements".

The plurality of the SAW resonators 201-208, 211, 212, 213, and 214 define and function as band-pass filters (BPFs) each having a resonant frequency and each having individual band-pass characteristics. The plurality of SAW resonators 201-208 are connected in series with each other between the first series connection terminal P21 and the second series connection terminal P22.

The SAW resonator 211 is connected between a connection node of the SAW resonators 202 and 203 and the first shunt connection terminal P231. More specifically, one end of the SAW resonator 211 is connected to a predetermined point of a connection path that connects the SAW resonators 202 and 203 to each other via a connection conductor 311. The other end of the SAW resonator 211 is connected to the first shunt connection terminal P231 via a connection conductor 312.

The SAW resonator 214 is connected between a connection node of the SAW resonators 204 and 205 and the first shunt connection terminal P232. More specifically, one end of the SAW resonator 214 is connected to a predetermined point of a connection path that connects the SAW resonators 204 and 205 to each other via a connection conductor 317. The other end of the SAW resonator 214 is connected to the first shunt connection terminal P232 via a connection conductor 318.

The SAW resonator 212 is connected between a connection node of the SAW resonators 206 and 207 and the second shunt connection terminal P24. The SAW resonator 213 is connected between a connection node of the SAW resonator 208 and the second series connection terminal P22 and the second shunt connection terminal P24. More specifically, one end of the SAW resonator 212 is connected to a predetermined point of connection path that connects the SAW resonators 206 and 207 to each other via a connection conductor 313. The other end of the SAW resonator 212 is connected to one end of a connection conductor 314. One end of the SAW resonator 213 is connected to a predetermined point of connection path that connects the SAW resonator 208 and the second series connection terminal P22 to each other via a connection conductor 315. The other end of the SAW resonator 213 is connected to one end of a connection conductor 316. The other end of the connection conductors 314 and 316 are connected to the second shunt connection terminal P24. That is, the second shunt connection terminal P24 is a terminal common to the connection conductors 314 and 316, and collectively connects the connection conductors 314 and 316 to ground.

The connection conductors 311, 312, 313, 314, 315, 316, 317, and 318 correspond to "connection units".

With the configuration described above, the filter unit 20 defines a so-called ladder filter, and combines the band-pass characteristics and the attenuation characteristics of the SAW resonators 201-208, 211, 212, 213, and 214 to implement the desired band-pass characteristics and attenuation characteristics outside the pass band as the filter unit 20.

In the common circuit configuration of the high-frequency modules 11, 12, 13, and 14 described above, specifically, each high-frequency module has the following circuit configuration.

First Example Circuit

The high-frequency module 11 illustrated in FIG. 1 includes series-connected matching elements 41 and 42. One of the matching elements 41 and 42 can be omitted.

The matching element 41 is connected between the first series connection terminal P21 of the filter unit 20 and the first external connection terminal P1. Specifically, the matching element 41 is an inductor 41L illustrated in FIG. 5A which is connected in series between the first series connection terminal P21 and the first external connection terminal P1, or a capacitor 41C illustrated in FIG. 5B which is connected in series between the first series connection terminal P21 and the first external connection terminal P1. The element value (inductance or capacitance) of the matching element 41 is set to an element value that achieves impedance matching between a circuit connected to the first external connection terminal P1 side and the filter unit 20.

The matching element 42 is connected between the second series connection terminal P22 of the filter unit 20 and the second external connection terminal P2. Specifically, the matching element 42 is an inductor 42L illustrated in FIG. 5E which is connected in series between the second series connection terminal P22 and the second external connection terminal P2, or a capacitor 42C illustrated in FIG. 5F which is connected in series between the second series connection terminal P22 and the second external connection terminal P2. The element value (inductance or capacitance) of the matching element 42 is set to an element value that achieves impedance matching between a circuit connected to the second external connection terminal P2 side and the filter unit 20.

In addition, at least one of the matching elements 41 and 42 is inductively coupled or capacitively coupled to at least one of the connection conductors 311, 312, 313, 314, 315, 316, 317, and 318 of the filter unit 20.

More specifically, the matching element 41 is coupled to at least one of the connection conductors 311, 312, 313, 314, 315, 316, 317, and 318. For example, if the matching element 41 is the inductor 41L, the inductor 41L is inductively or capacitively coupled to at least one of the connection conductors 311, 312, 313, 314, 315, 316, 317, and 318. If the matching element 41 is the capacitor 41C, the capacitor 41C is capacitively coupled to at least one of the connection conductors 311, 312, 313, 314, 315, 316, 317, and 318. That is, the matching element 41 is inductively coupled or capacitively coupled to at least one of the connection conductors to be connected to the SAW resonators 211, 212, 213, and 214, which are shunt-connected in the filter unit 20.

The matching element 42 is coupled to at least one of the connection conductors 311, 312, 313, 314, 315, 316, 317, and 318. For example, if the matching element 42 is the inductor 42L, the inductor 42L is inductively coupled or capacitively coupled to at least one of the connection conductors 311, 312, 313, 314, 315, 316, 317, and 318. If the matching element 42 is the capacitor 42C, the capacitor 42C is capacitively coupled to at least one of the connection conductors 311, 312, 313, 314, 315, 316, 317, and 318. That is, the matching element 42 is inductively coupled or capacitively coupled to at least one of the connection conductors to be connected to the SAW resonators 211, 212, 213, and 214, which are shunt-connected in the filter unit 20.

Note that each of the matching element 41 and the matching element 42 may be coupled to any of the connection conductors or at least one of the matching elements 41 and 42 may be coupled to any of the connection conductors.

With the configuration described above, a connection conductor and a matching element to be coupled to each other are connected in terms of high frequency. For example, if the matching element 41 is the inductor 41L and the inductor 41L is inductively coupled to the connection conductor 316 (see FIG. 1), an inductive coupling circuit having a mutual inductance M is provided between the inductor 41L (the matching element 41) and the connection conductor 316. Thus, high-frequency signals are not propagated only through a main propagation path defined by the filter unit 20 as a path of propagation between the first external connection terminal P1 and the second external connection terminal P2, but some high-frequency signals are also propagated through a sub-propagation path defined by the inductor 41L (the matching element 41), the inductive coupling circuit, and the connection conductor 316 as a path of propagation.

Accordingly, the high-frequency module 11 has combined transmission characteristics in which the transmission characteristics of the main propagation path and the transmission characteristics of the sub-propagation path are combined.

Here, by adjusting the method of coupling of a matching element and a connection conductor to be coupled to each other and the degree of coupling between them, the amplitude and phase of a high-frequency signal that propagates through the sub-propagation path is able to be adjusted. In other words, the transmission characteristics of the sub-propagation path are able to be adjusted. Examples of the transmission characteristics include attenuation characteristics (amplitude characteristics) and phase characteristics.

Further, adjusting the method of coupling and the degree of coupling provide a sub-propagation path on only the attenuation characteristics outside the pass band, substantially without having an effect on the transmission characteristics for the frequency band of the high-frequency signal (desired high-frequency signal) to be transmitted through the high-frequency module 11.

In addition, by adjusting the transmission characteristics of the sub-propagation path in the way described above, the transmission characteristics of the high-frequency module 11 are able to be adjusted. For example, as described below, the attenuation characteristics outside the pass band are able to be adjusted.

In this case, unlike the configuration of the related art, no additional inductor or capacitor is required to adjust the transmission characteristics of a high-frequency filter. Thus, a high-frequency filter having the desired attenuation characteristics has a simple configuration. Accordingly, the high-frequency filter is compact.

In the configuration described above, furthermore, connection conductors that are not connected in series between the first external connection terminal P1 and the second external connection terminal P2 are coupled to matching elements. Thus, the line length of a connection path between the first external connection terminal P1 and the second external connection terminal P2 is able to be appropriately set. For example, the line length of the connection path is able to be significantly reduced. Accordingly, transmission loss caused by conductor loss is significantly reduced.

In addition, mutual inductance caused by the coupling described above increases the effective inductance value of the inductor 41L (the matching element 41). This also further reduces the line length of the inductor 41L.

Second Example Circuit

The high-frequency module 12 illustrated in FIG. 2 includes shunt-connected matching elements 43 and 44. One of the matching elements 43 and 44 can be omitted.

The matching element 43 is connected between a connection path 401 that connects the first series connection terminal P21 of the filter unit 20 and the first external connection terminal P1 to each other and ground. Specifically, the matching element 43 is an inductor 43L illustrated in FIG. 5C which is connected between the connection path 401 that connects the first series connection terminal P21 and the first external connection terminal P1 to each other and ground, or a capacitor 43C illustrated in FIG. 5D which is connected between the connection path 401 that connects the first series connection terminal P21 and the first external connection terminal P1 to each other and ground. The element value (inductance or capacitance) of the matching element 43 is set to an element value that achieves impedance matching between a circuit connected to the first external connection terminal P1 side and the filter unit 20.

The matching element 44 is connected between a connection path 402 that connects the second series connection terminal P22 of the filter unit 20 and the second external connection terminal P2 to each other and ground. Specifically, the matching element 44 is an inductor 44L illustrated in FIG. 5G which is connected between the connection path 402 that connects the second series connection terminal P22 and the second external connection terminal P2 to each other and ground, or a capacitor 44C illustrated in FIG. 5H which is connected between the connection path 402 that connects the second series connection terminal P22 and the second external connection terminal P2 to each other and ground. The element value (inductance or capacitance) of the matching element 44 is set to an element value that achieves impedance matching between a circuit connected to the second external connection terminal P2 side and the filter unit 20.

In addition, at least one of the matching elements 43 and 44 is inductively coupled or capacitively coupled to at least one of the connection conductors 311, 312, 313, 314, 315, 316, 317, and 318 of the filter unit 20.

More specifically, the matching element 43 is coupled to at least one of the connection conductors 311, 312, 313, 314, 315, 316, 317, and 318. For example, if the matching element 43 is the inductor 43L, the inductor 43L is inductively or capacitively coupled to at least one of the connection conductors 311, 312, 313, 314, 315, 316, 317, and 318. If the matching element 43 is the capacitor 43C, the capacitor 43C is capacitively coupled to at least one of the connection conductors 311, 312, 313, 314, 315, 316, 317, and 318. That is, the matching element 43 is inductively coupled or capacitively coupled to at least one of the connection conductors to be connected to the SAW resonators 211, 212, 213, and 214, which are shunt-connected in the filter unit 20.

The matching element 44 is coupled to at least one of the connection conductors 311, 312, 313, 314, 315, 316, 317, and 318. For example, if the matching element 44 is the inductor 44L, the inductor 44L is inductively coupled or capacitively coupled to at least one of the connection conductors 311, 312, 313, 314, 315, 316, 317, and 318. If the matching element 44 is the capacitor 44C, the capacitor 44C is capacitively coupled to at least one of the connection conductors 311, 312, 313, 314, 315, 316, 317, and 318. That is, the matching element 44 is inductively coupled or capacitively coupled to at least one of the connection conductors to be connected to the SAW resonators 211, 212, 213, and 214, which are shunt-connected in the filter unit 20.

Note that each of the matching element 43 and the matching element 44 may be coupled to any of the connection conductors or at least one of the matching elements 43 and 44 may be coupled to any of the connection conductors.

With the configuration described above, a connection conductor and a matching element to be coupled to each other are connected in terms of high frequency. For example, if the matching element 44 is the capacitor 44C and the capacitor 44C is capacitively coupled to the connection conductor 311 (see FIG. 2), a capacitive coupling circuit having a coupling capacitance $C_M$ is provided between the capacitor 44C (the matching element 44) and the connection conductor 311. Thus, high-frequency signals are not propagated only through a main propagation path defined by the filter unit 20 as a path of propagation between the first external connection terminal P1 and the second external connection terminal P2, but some high-frequency signals are also propagated through a sub-propagation path defined by the connection conductor 311, the capacitive coupling circuit, and the capacitor 44C (the matching element 44) as a path of propagation.

Accordingly, the high-frequency module 12 has combined transmission characteristics in which the transmission characteristics of the main propagation path and the transmission characteristics of the sub-propagation path are combined.

Similarly to the high-frequency module 11 described above, the high-frequency module 12 having the configuration described above also achieves the desired attenuation characteristics with a simpler configuration than the configuration of the related art.

Third Example Circuit

The high-frequency module 13 illustrated in FIG. 3 includes a series-connected matching element 41 and a shunt-connected matching element 44.

The matching element 41 is connected between the first series connection terminal P21 of the filter unit 20 and the first external connection terminal P1. Specifically, the matching element 41 is the inductor 41L illustrated in FIG. 5(A) which is connected in series between the first series connection terminal P21 and the first external connection terminal P1, or the capacitor 41C illustrated in FIG. 5B which is connected in series between the first series connection terminal P21 and the first external connection terminal P1. The element value (inductance or capacitance) of the matching element 41 is set to an element value that achieves impedance matching between a circuit connected to the first external connection terminal P1 side and the filter unit 20.

The matching element 44 is connected between the connection path 402 that connects the second series connection terminal P22 of the filter unit 20 and the second external connection terminal P2 to each other and ground. Specifically, the matching element 44 is the inductor 44L illustrated in FIG. 5G which is connected between the connection path 402 that connects the second series connection terminal P22 and the second external connection terminal P2 to each other and ground, or the capacitor 44C illustrated in FIG. 5H which is connected between the connection path 402 that connects the second series connection terminal P22 and the second external connection terminal P2 to each other and ground. The element value (inductance or capacitance) of the matching element 44 is set to an element value that achieves impedance matching between a circuit connected to the second external connection terminal P2 side and the filter unit 20.

In addition, at least one of the matching elements 41 and 44 is inductively coupled or capacitively coupled to at least one of the connection conductors 311, 312, 313, 314, 315, 316, 317, and 318 of the filter unit 20.

More specifically, the matching element 41 is coupled to at least one of the connection conductors 311, 312, 313, 314, 315, 316, 317, and 318. For example, if the matching element 41 is the inductor 41L, the inductor 41L is inductively coupled or capacitively coupled to at least one of the connection conductors 311, 312, 313, 314, 315, 316, 317, and 318. If the matching element 41 is the capacitor 41C, the capacitor 41C is capacitively coupled to at least one of the connection conductors 311, 312, 313, 314, 315, 316, 317, and 318. That is, the matching element 41 is inductively coupled or capacitively coupled to at least one of the connection conductors to be connected to the SAW resonators 211, 212, 213, and 214, which are shunt-connected in the filter unit 20.

The matching element 44 is coupled to at least one of the connection conductors 311, 312, 313, 314, 315, 316, 317, and 318. For example, if the matching element 44 is the inductor 44L, the inductor 44L is inductively coupled or capacitively coupled to at least one of the connection conductors 311, 312, 313, 314, 315, 316, 317, and 318. If the matching element 44 is the capacitor 44C, the capacitor 44C is capacitively coupled to at least one of the connection conductors 311, 312, 313, 314, 315, 316, 317, and 318. That is, the matching element 44 is inductively coupled or capacitively coupled to at least one of the connection conductors to be connected to the SAW resonators 211, 212, 213, and 214, which are shunt-connected in the filter unit 20.

Note that each of the matching element 13 and the matching element 44 may be coupled to any of the connection conductors or at least one of the matching elements 41 and 44 may be coupled to any of the connection conductors.

Accordingly, the high-frequency module 13 has combined transmission characteristics in which the transmission characteristics of a main propagation path extending through the filter unit 20 and the transmission characteristics of a sub-propagation path extending through a coupling unit are combined. Similarly to the high-frequency modules 11 and 12 described above, the high-frequency module 13 having the configuration described above also achieves the desired attenuation characteristics with a simpler configuration than the configuration of the related art.

Fourth Example Circuit

The high-frequency module 14 illustrated in FIG. 4 includes a shunt-connected matching element 42 and a series-connected matching element 43.

The matching element 42 is connected between the second series connection terminal P22 of the filter unit 20 and the second external connection terminal P2. Specifically, the matching element 42 is the inductor 42L illustrated in FIG. 5E which is connected in series between the second series connection terminal P22 and the second external connection terminal P2, or the capacitor 42C illustrated in FIG. 5F which is connected in series between the second series connection terminal P22 and the second external connection terminal P2. The element value (inductance or capacitance) of the matching element 42 is set to an element value that achieves impedance matching between a circuit connected to the second external connection terminal P2 side and the filter unit 20.

The matching element 43 is connected between the connection path 401 connecting the first series connection terminal P21 of the filter unit 20 to the first external connection terminal P1, and ground. Specifically, the matching element 43 is the inductor 43L illustrated in FIG. 5C which is connected between the first series connection terminal P21, the first external connection terminal P1, the connection path 401, and ground, or the capacitor 43C illustrated in FIG. 5D which is connected between the connection path 401 that connects the first series connection terminal P21 and the first external connection terminal P1 to each other and ground. The element value (inductance or capacitance) of the matching element 43 is set to an element value that achieves impedance matching between a circuit connected to the first external connection terminal P1 side and the filter unit 20.

In addition, at least one of the matching elements 42 and 43 is inductively coupled or capacitively coupled to at least one of the connection conductors 311, 312, 313, 314, 315, 316, 317, and 318 of the filter unit 20.

More specifically, the matching element 42 is coupled to at least one of the connection conductors 311, 312, 313, 314, 315, 316, 317, and 318. For example, if the matching element 42 is the inductor 42L, the inductor 42L is inductively coupled or capacitively coupled to at least one of the connection conductors 311, 312, 313, 314, 315, 316, 317, and 318. If the matching element 42 is the capacitor 42C, the capacitor 42C is capacitively coupled to at least one of the connection conductors 311, 312, 313, 314, 315, 316, 317, and 318. That is, the matching element 42 is inductively coupled or capacitively coupled to at least one of the connection conductors to be connected to the SAW resonators 211, 212, 213, and 214, which are shunt-connected in the filter unit 20.

The matching element 43 is coupled to at least one of the connection conductors 311, 312, 313, 314, 315, 316, 317, and 318. For example, if the matching element 43 is the inductor 43L, the inductor 43L is inductively coupled or capacitively coupled to at least one of the connection conductors 311, 312, 313, 314, 315, 316, 317, and 318. If the matching element 43 is the capacitor 43C, the capacitor 43C is capacitively coupled to at least one of the connection conductors 311, 312, 313, 314, 315, 316, 317, and 318. That is, the matching element 43 is inductively coupled or capacitively coupled to at least one of the connection conductors to be connected to the SAW resonators 211, 212, 213, and 214, which are shunt-connected in the filter unit 20.

Note that each of the matching element 42 and the matching element 43 may be coupled to any of the connection conductors or at least one of the matching elements 42 and 43 may be coupled to any of the connection conductors.

Accordingly, the high-frequency module 14 has combined transmission characteristics in which the transmission characteristics of a main propagation path extending through the filter unit 20 and the transmission characteristics of a sub-propagation path extending through a coupling unit are combined. Similarly to the high-frequency modules 11, 12, and 13 described above, the high-frequency module 14 having the configuration described above also achieves the desired attenuation characteristics with a simpler configuration than the configuration of the related art.

Figure 6:
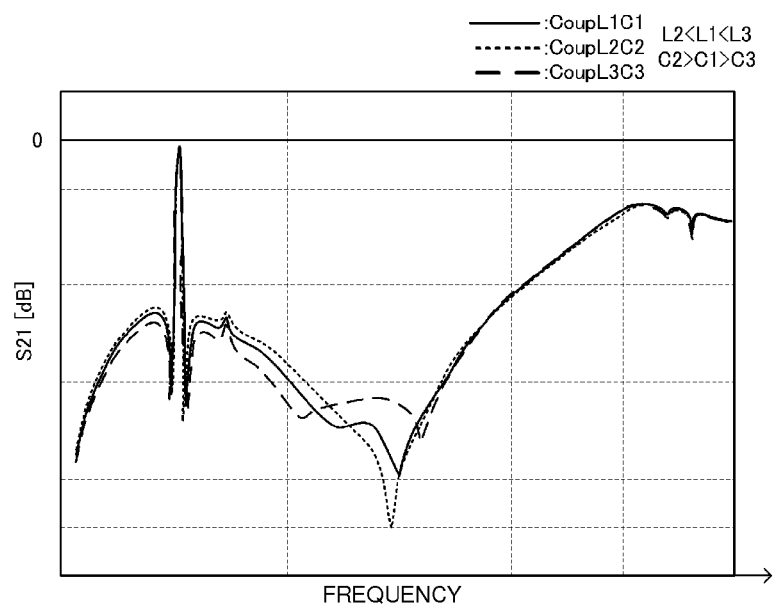
FIG. 6 is a graph illustrating a change in the bandpass characteristics of a high-frequency module when the degree of coupling between a matching element and a connection conductor changes.

FIG. 6 is a graph illustrating a change in the bandpass characteristics of a high-frequency module when the degree of coupling between a matching element and a connection conductor changes. The horizontal axis in FIG. 6 represents frequency, and the vertical axis in FIG. 6 represents the attenuation of a signal propagated from the first external connection terminal P1 to the second external connection terminal P2. Characteristics represented by the dotted line illustrated in FIG. 6 exhibit weaker inductive coupling and stronger capacitive coupling than characteristics represented by the solid line. Characteristics represented by the broken line illustrated in FIG. 6 exhibit stronger inductive coupling and weaker capacitive coupling than the characteristics represented by the solid line. Note that the characteristics illustrated in FIG. 6 are obtained when a ladder structure is used in which a SAW resonator is connected between the connecting position of the SAW resonators 202 and 203 of the filter unit 20 and ground, a SAW resonator is connected between the connecting position of the SAW resonators 204 and 205 and ground, and a SAW resonator is connected between the connecting position of the SAW resonators 206 and 207 and ground. The high-frequency module in this preferred embodiment preferably is a band pass filter whose pass band is the 800 MHz band, for example.

As illustrated in FIG. 6, as the inductive coupling becomes strong and the capacitive coupling becomes weak, the frequency of the attenuation pole that appears on the high-frequency side of the pass band becomes high. In contrast, as the inductive coupling becomes weak and the capacitive coupling becomes strong, the frequency of the attenuation pole that appears on the high-frequency side of the pass band becomes low. In FIG. 6, the frequency of the attenuation pole refers to a peak frequency substantially at the center of the frequency axis.

In addition, appropriately setting the inductive coupling and the capacitive coupling changes the attenuation characteristics on the high-frequency side of the pass band. For example, as the capacitive coupling becomes strong and the inductive coupling becomes weak, the attenuation around the pass band decreases, whereas a large attenuation can be obtained at the frequency of the attenuation pole. In addition, as the capacitive coupling becomes weak and the inductive coupling becomes strong, a larger attenuation can be obtained around the pass band.

As illustrated in FIG. 6, furthermore, the frequency position and the frequency width of the pass band and the insertion loss at the pass band are not substantially changed without being substantially affected by the strength of the inductive coupling and capacitive coupling.

Accordingly, by appropriately adjusting the method of coupling and the degree of coupling using the configuration of this preferred embodiment, the attenuation characteristics on the high-frequency side to the desired characteristics are able to be adjusted without any change in the characteristics of the pass band. In other words, a high-frequency module having the desired pass-band characteristics and attenuation characteristics is provided.

Figure 7:
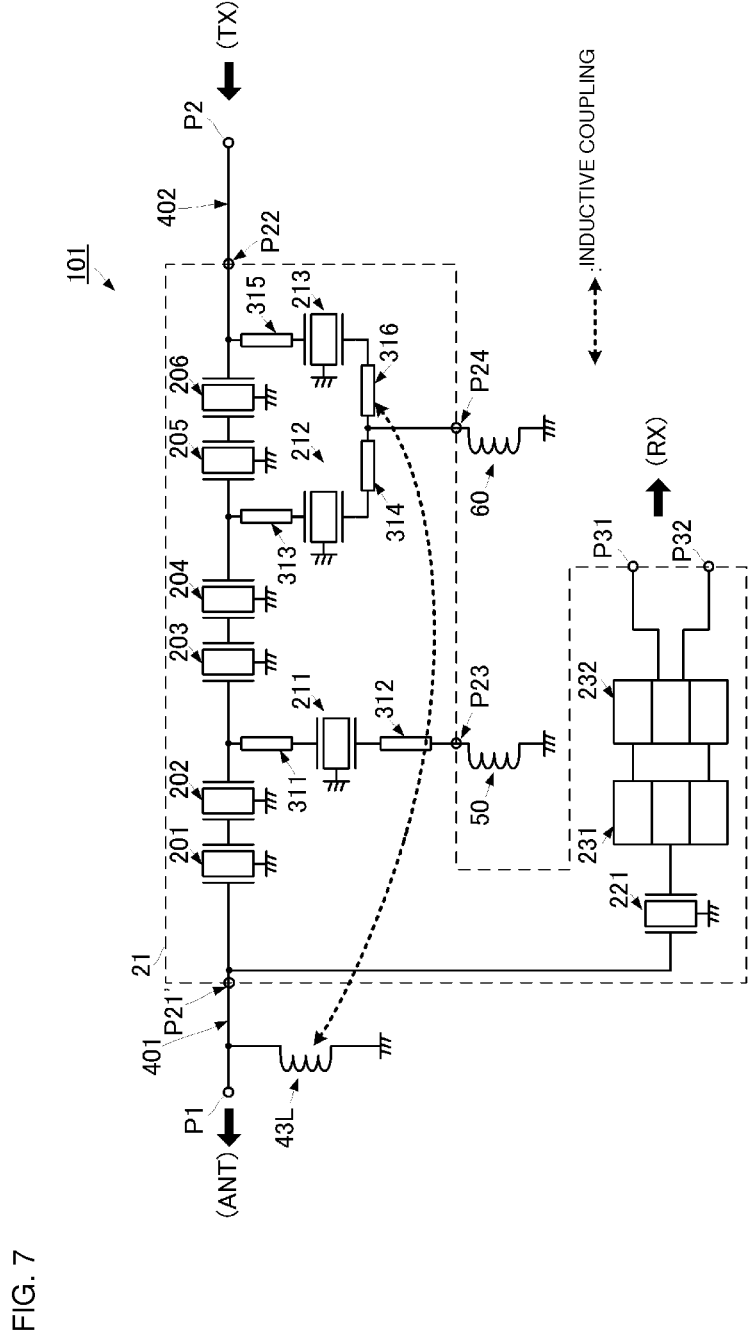
FIG. 7 is an equivalent circuit diagram of a high-frequency module having a duplexer configuration.

A high-frequency module having the configuration described above can be used in a duplexer configuration illustrated in FIG. 7 as a specific application example. FIG. 7 is an equivalent circuit diagram of a high-frequency module having a duplexer configuration.

A high-frequency module 101 includes a filter unit 21, a first external connection terminal P1, a second external connection terminal P2, and a third external connection terminal defining and functioning as also as third terminals P31 and P32 of the filter unit 21. In a specific application example, the first external connection terminal P1 is connected to an antenna. The second external connection terminal P2 is connected to a transmitting circuit. The third external connection terminal (the third terminals P31 and P32) is connected to a receiving circuit.

The filter 21 includes a first series connection terminal P21', a second series connection terminal P22, a first shunt connection terminal P23, a second shunt connection terminal P24, and the third terminals P31 and P32.

The first series connection terminal P21' is connected to the first external connection terminal P1 via a connection path 401. An inductor 43L corresponding to the matching element described above is connected between the connection path 401 and ground. The second series connection terminal P22 is connected to the second external connection terminal P2 via a connection path 402.

A plurality of SAW resonators 201, 202, 203, 204, 205, and 206 are connected in series with each other between the first series connection terminal P21' and the second series connection terminal P22.

A connection node between the SAW resonator 202 and the SAW resonator 203, or a predetermined point of a connection path that connects the SAW resonator 202 and the SAW resonator 203 to each other, is connected to one end of a SAW resonator 211 with a connection conductor 311 interposed therebetween. The other end of the SAW resonator 211 is connected to the first shunt connection terminal P23 via a connection conductor 312. The first shunt connection terminal P23 is connected to ground via an inductor 50.

A connection node between the SAW resonator 204 and the SAW resonator 205, or a predetermined point of a connection path that connects the SAW resonator 204 and the SAW resonator 205 to each other, is connected to one end of a SAW resonator 212 via the connection conductor 313. The other end of the SAW resonator 212 is connected to the second shunt connection terminal P24 via a connection conductor 314.

A connection node between the SAW resonator 206 and the second series connection terminal P22, or a predetermined point of a connection path that connects the SAW resonator 204 and the second series connection terminal P22 to each other, is connected to one end of a SAW resonator 213 via a connection conductor 315. The other end of the SAW resonator 213 is connected to the second shunt connection terminal P24 via a connection conductor 316.

With the configuration described above, by combining the band-pass characteristics and the attenuation characteristics of the SAW resonators 201-208, 211, 212, and 213 between the first series connection terminal P21' and the second series connection terminal P22, the filter unit 21 implements desired first band-pass characteristics and first attenuation characteristics outside a first pass band between the first and second series connection terminals of the filter unit 21.

A SAW resonator 221 and longitudinally-coupled SAW resonators 231 and 232 are connected in series with each other between the first series connection terminal P21' and the third terminals P31 and P32. With the configuration described above, by combining the band-pass characteristics and the attenuation characteristics of the SAW resonators 221, 231, and 232 between the first series connection terminal P21' and the third terminals P31 and P32, the filter unit 21 implements desired second band-pass characteristics and second attenuation characteristics outside a second pass band between the first series connection terminal of the filter unit 21 and the third terminals. The second pass band is a frequency band different from the first pass band, and the second pass band is set in an attenuation band outside the first pass band.

Accordingly, the filter unit 21 defines and functions as a duplexer including the first series connection terminal P21' as a common terminal, and the second series connection terminal P22 and the third terminals P31 and P32 as individual terminals.

In the high-frequency module 101, furthermore, the inductor 43L is inductively coupled to one of the connection conductors 311, 312, 313, 314, 315, and 316. By adjusting the degree of coupling between them, the first attenuation characteristics is able to be adjusted.

Here, the use of the configuration of this preferred embodiment adjusts the band width of a frequency band in which a large attenuation is obtained in the first attenuation characteristics so that the frequency band overlaps the second pass band, and also adjusts the attenuation in the frequency band. This is achievable by adjusting the selection of the connection conductor 311, 312, 313, 314, 315, or 316 to be coupled to the inductor 43L and by adjusting the degree of coupling between the connection conductor to be coupled and the inductor 43L.

Figure 8:
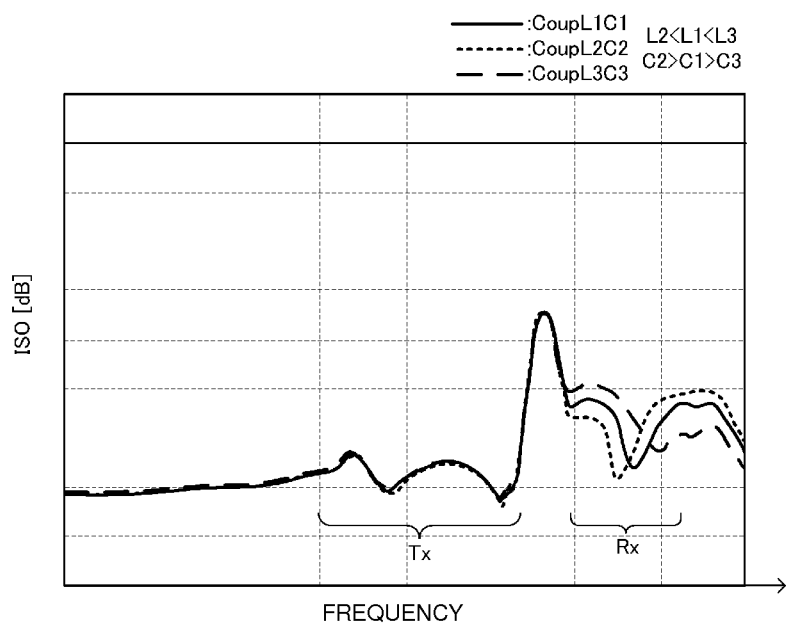
FIG. 8 is a graph illustrating a change in the isolation between a second external connection terminal and a third external connection terminal of the high-frequency module when the degree of coupling between a matching element and a connection conductor changes.

FIG. 8 is a graph illustrating a change in the isolation between a second external connection terminal and a third external connection terminal of a high-frequency module when the degree of coupling between a matching element and a connection conductor changes. The horizontal axis in FIG. 8 represents frequency, and the vertical axis in FIG. 8 represents isolation. FIG. 8 reveals that the lower the isolation, the stronger the isolation between the second series connection terminal and the third terminals. Characteristics represented by the dotted line illustrated in FIG. 8 exhibit weaker inductive coupling and stronger capacitive coupling than characteristics represented by the solid line. Characteristics represented by the broken line illustrated in FIG. 8 exhibit stronger inductive coupling and weaker capacitive coupling than the characteristics represented by the solid line.

As illustrated in FIG. 8, by adjusting the inductive coupling and the capacitive coupling, the isolation and the isolation characteristics in the pass band of the receiving circuit Rx (on the third terminal side) are adjusted. As illustrated in FIG. 8, furthermore, even if the inductive coupling and the capacitive coupling are adjusted, the isolation and the isolation characteristics in the pass band of the transmitting circuit Tx (on the second terminal side) are not substantially changed.

In the manner described above, the use of the configuration of the high-frequency module 101 appropriately adjusts the isolation characteristics between the second series connection terminal and the third terminals. That is, the isolation characteristics between the transmitting circuit and the receiving circuit is able to be optimized.

A high-frequency module having the configuration described above can be implemented by the following example structures. In the following, example structural implementations of the high-frequency module 101 having the duplexer configuration described above are described.

First Structure

Figure 9:
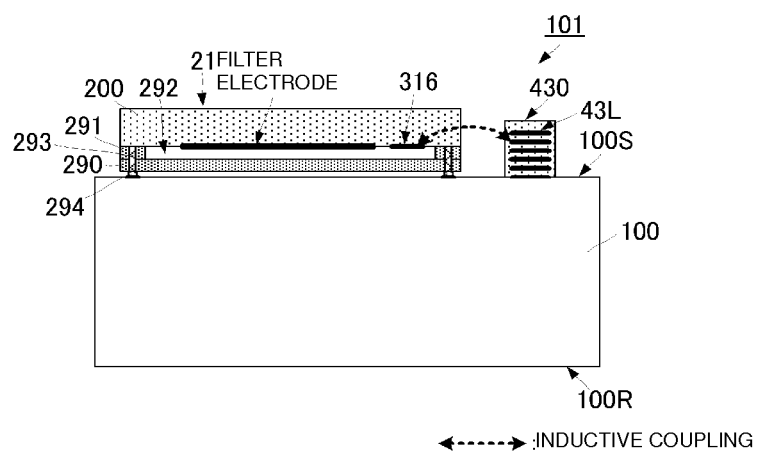
FIG. 9 is a conceptual side view illustrating the main structure of a first structure of the high-frequency module.

FIG. 9 is a conceptual side view illustrating the main structure of a high-frequency module. The high-frequency module 101 includes a multi-layer substrate 100, a filter substrate 200, a cover layer 290, a side surface cover layer 291, and a mount-type circuit element 430.

The multi-layer substrate 100 is formed preferably by stacking a plurality of dielectric layers. An electrode having a predetermined pattern is provided on a surface 100S of the multi-layer substrate 100 and in internal layers of the multi-layer substrate 100, and a wiring pattern of the high-frequency module 101, except the filter unit 21, and the inductors 50 and are provided. The multi-layer substrate 100 has external connection electrodes provided on a bottom surface 100R thereof, and the external connection electrodes implement the first external connection terminal P1, the second external connection terminal P2, and the third external connection terminal described above.

The filter unit 21 is defined by the filter substrate 200, the cover layer 290, the side surface cover layer 291, a connection electrode 293, and a mounting electrode 294.

The filter substrate 200 includes a flat-plate-shaped piezoelectric substrate. The filter substrate 200 has a first principal surface on which a filter electrode is provided ed. The filter electrode includes, for example, a so-called IDT electrode. In the manner described above, the formation of an IDT electrode on a principal surface of a piezoelectric substrate defines each of the SAW resonators described above. Electrode patterns implementing connection conductors including the connection conductor 316 are also provided on the first principal surface of the filter substrate 200. The cover layer 290 having a flat plate shape is disposed on the first principal surface side of the filter substrate 200. The cover layer 290 is composed of a flat-plate-shaped insulating material, and has the same shape as the filter substrate 200 when viewed in plan. Further, the cover layer 290 is arranged so as to overlap the filter substrate 200 when viewed in plan, and is arranged to be spaced a predetermined distance from the first principal surface of the filter substrate 200.

The side surface cover layer 291 is disposed between the first principal surface of the filter substrate 200 and the cover layer 290. The side surface cover layer 291 is also composed of an insulating material, and is provided only within a range having a predetermined width extending inwardly from the outer peripheral end for the entire periphery of the filter substrate 200 and the cover layer 290, when viewed in plan. That is, the cover layer 290 has a frame-shaped structure having an opening in the center thereof.

With the arrangement of the cover layer 290 and the side surface cover layer 291 in the manner described above, the region where the filter electrode is formed on the first principal surface of the filter substrate 200 is within an enclosed space 292 defined by the filter substrate 200, the cover layer 290, and the side surface cover layer 291. This improves the resonance characteristics of a SAW resonator, resulting in an accurate implementation of the desired characteristics of a filter.

The connection electrode 293 is shaped so as to have one end coming into contact with the first principal surface of the filter substrate 200 and another end exposed on a surface of the cover layer 290 opposite to the filter substrate 200. In this case, the connection electrode 293 extends through the side surface cover layer 291 and the cover layer 290. The one end of the connection electrode 293 is connected to the electrode pattern provided on the first principal surface of the filter substrate 200.

The mounting electrode 294 is connected to the other end of the connection electrode 293, and has a shape projecting from the surface of the cover layer 290 opposite to the filter substrate 200. A plurality of sets each including the connection electrode 293 and the mounting electrode 294 are disposed to implement the first series connection terminal P21', the second series connection terminal P22, the third terminals P31 and P32, the fourth terminal P23, and the fifth terminal P24 of the filter unit 21 described above. Note that the other end of the connection electrode 293 may be provided with a bump of solder, Au, or the like and may be connected to the mounting electrode 294 via the bump.

The configuration described above allows the filter unit 21 to have a so-called WLP (Wafer Level Package) structure, and the filter unit 21 is compact.

The filter unit 21 having the WLP structure is mounted on the top surface (mounting surface) 100S of the multi-layer substrate 100. Thus, the filter unit 21 is connected to the first external connection terminal P1, the second external connection terminal P2, and the third external connection terminal.

The inductor 43L is implemented by the mount-type circuit element 430. Specifically, the mount-type circuit element 430 has a rectangular or substantially rectangular parallelepiped housing composed of an insulating material, and a spiral electrode defining and functioning as the inductor 43L is provided in the housing. The spiral electrode is implemented by tubular linear electrodes extending along the outer periphery of the housing, portions of which are cut away, and interlayer connection electrodes. The linear electrodes in the respective layers are connected together by the interlayer connection electrodes to define a single linear electrode. Both ends of the spiral electrode are connected to external connection electrodes provided on opposing end surfaces of the housing.

The mount-type circuit element 430 having the configuration described above is also mounted on the top surface (mounting surface) 100S of the multi-layer substrate 100 in a manner similar to that of the filter unit 21. Here, the connection path connecting the first series connection terminal P21' of the filter unit 21 and the first external connection terminal P1 to each other is provided on the top surface 100S of the multi-layer substrate 100 and in the multi-layer substrate 100, and a ground electrode is provided in the multi-layer substrate 100 and is connected to a mounting land of the mount-type circuit element 430. Thus, a structure in which the inductor 43L is connected between the connection path connecting the first series connection terminal P21' of the filter unit 21 and the first external connection terminal P1 to each other and ground is provided.

Further, the mount-type circuit element 430 implementing the inductor 43L is located in close proximity to the filter unit 21 having the WLP structure, thus achieving inductive coupling between the inductor 43L and a predetermined connection conductor of the filter unit 21.

Figure 10:
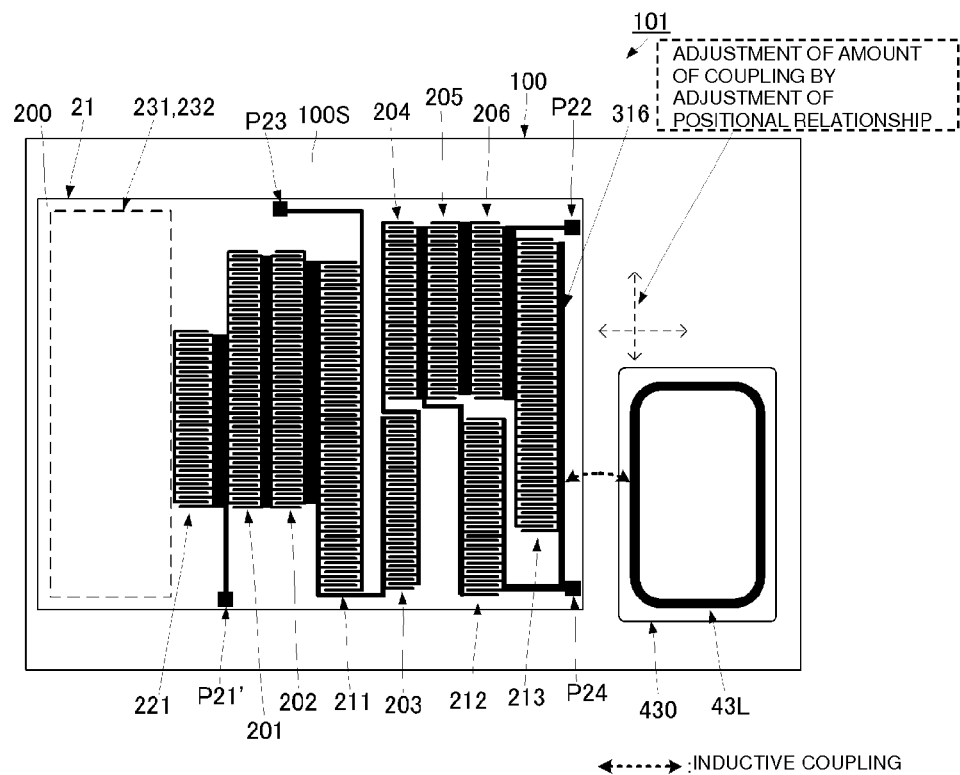
FIG. 10 is a conceptual plan view illustrating the main structure of the first structure of the high-frequency module.

The electrode pattern constituting the filter unit 21 has a structure illustrated in, for example, FIG. 10. FIG. 10 is a conceptual plan view illustrating the main structure of a high-frequency module. Specifically, on the first principal surface of the filter substrate 200, IDT electrodes constituting the SAW resonators 201-206, 211, 212, 213, and 221, IDT electrodes constituting the longitudinally-coupled SAW resonators 231 and 232, and electrode patterns constituting the respective connection conductors are provided. Further, land electrodes constituting the terminals P21', P22, P23, and P24 are also provided. The IDT electrodes, the electrode patterns constituting the connection conductors, and the land electrodes have a predetermined pattern configuration so as to implement the circuit configuration illustrated in FIG. 7.

In this case, the electrode pattern constituting the connection conductor 316 is located near a first end side of the filter substrate 200 so as to have a shape extending along the first end side.

Further, the mount-type circuit element 430 is mounted at a position in close proximity to the first end side of the filter substrate 200. Thus, the inductor 43L constituted by the spiral electrode of the mount-type circuit element 430 and the connection conductor 316 constituted by the linear electrode pattern are located in close proximity to each other, thus producing inductive coupling, as indicated by the thick dotted-line arrow in FIG. 10. The configuration described above allows the high-frequency module 101 having the desired attenuation characteristics to be implemented without using any additional element for adjusting attenuation characteristics.

Here, the arrangement position of the mount-type circuit element 430 is changed on the top surface 100S of the multi-layer substrate 100 in the directions indicated by thin broken-line arrows in FIG. 10. Thus, the distance between the inductor 43L constituted by the spiral electrode of the mount-type circuit element 430 and the connection conductor 316 constituted by the linear electrode pattern and the length of extending electrodes which oppose each other are adjusted. The configuration described above adjusts the inductive coupling between the inductor 43L and the connection conductor 316, and the adjustment of the attenuation characteristics results in an accurate implementation of the desired attenuation characteristics.

In FIG. 10, an example is illustrated in which longitudinal side surfaces of the mount-type circuit element 430 and the first end side of the filter substrate 200 are arranged in parallel or substantially in parallel to each other. Alternatively, a lateral side surface (an end surface on which an external connection electrode is formed) of the mount-type circuit element 430 and the first end side of the filter substrate 200 may be arranged in parallel or substantially in parallel to each other. However, the parallel or substantially parallel arrangement of the longitudinal side surfaces of the mount-type circuit element 430 and the first end side of the filter substrate 200 enables stronger inductive coupling to be achieved with more ease.

In FIG. 10, furthermore, an example is illustrated in which the mount-type circuit element 430 is mounted so that the center axis of the spiral electrode is perpendicular to the top surface 100S. Alternatively, the mount-type circuit element 430 may be mounted so that the center axis of the spiral electrode is parallel or substantially parallel to the top surface 100S.

Second Structure

Figure 11:
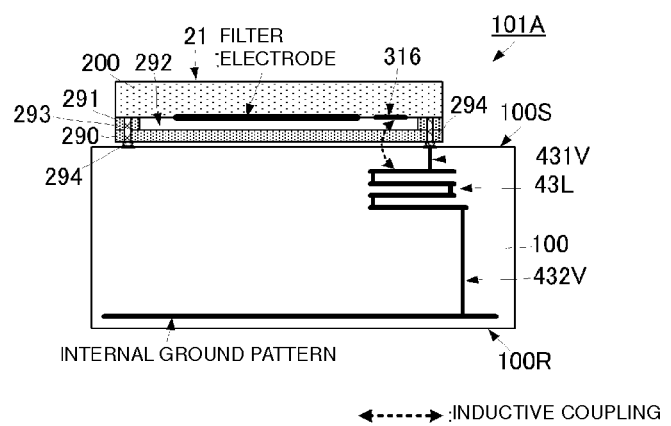
FIG. 11 is a conceptual side view illustrating the main structure of a second structure of the high-frequency module.

FIG. 11 is a conceptual side view illustrating the main structure of a high-frequency module. In a high-frequency module 101A illustrated in FIG. 11, the inductor 43L is not implemented by a mount-type circuit element but is implemented by an electrode pattern provided in the multi-layer substrate 100. The configuration of the filter unit 21 is the same as that of the high-frequency module 101 illustrated in FIG. 9 and FIG. 10, and is not described.

The inductor 43L, which is constituted by an electrode pattern of a spiral electrode, is provided in the multi-layer substrate 100. The spiral electrode is implemented by tubular linear electrodes provided in a plurality of dielectric layers constituting the multi-layer body 100, portions of which are cut away, and interlayer connection electrodes.

The linear electrodes in the respective dielectric layers are connected together in the stacking direction by the interlayer connection electrodes to define a single linear electrode. With the configuration described above, a spiral electrode whose center axis extends in the stacking direction is provided. One end of the spiral electrode constituting the inductor 43L is connected to a land electrode, on which the mounting electrode 294 defining and functioning as the first series connection terminal P21' of the filter unit 21 is mounted, via a via-conductor 431V. The land electrode is provided on the top surface 100S of the multi-layer substrate 100. The other end of the spiral electrode constituting the inductor 43L is connected to an internal ground pattern provided in the multi-layer substrate 100 near the bottom surface 100R through a via-conductor 432V.

The spiral electrode constituting the inductor 43L is also configured so that at least a portion of the spiral electrode overlaps the electrode pattern constituting the connection conductor 316 of the filter unit 21, when viewed in plan.

The configuration described above produces inductive coupling between the inductor 43L constituted by the spiral electrode in the multi-layer substrate 100 and the connection conductor 316 constituted by the linear electrode pattern provided on the first principal surface of the filter substrate 200, as indicated by the thick broken-line arrow in FIG. 11. In this case, by changing the distance between the spiral electrode constituting the inductor 43L and the electrode pattern constituting the connection conductor 316 of the filter unit 21 and the area of a portion where the spiral electrode and the electrode pattern overlap, the degree of coupling between the inductor 43L and the connection conductor 316 is adjusted. This enables the attenuation characteristics of the high-frequency module 101A to be adjusted in the manner similar to that of the first structure described above, resulting in a more accurate implementation of the desired attenuation characteristics.

In this preferred embodiment, furthermore, since the inductor 43L is not a mount-type circuit element, it is not necessary to provide a space for mounting the mount-type circuit element on the top surface 100S of the multi-layer substrate 100. This reduces the area of the multi-layer substrate 100 when viewed in plan, and reduces the plan-view area of the high-frequency module 101A.

Third Structure

Figure 12:
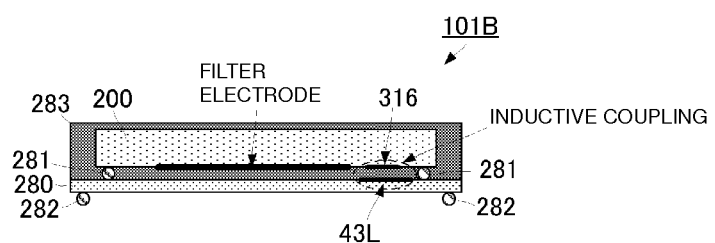
FIG. 12 is a conceptual side view illustrating the main structure of a third structure of the high-frequency module.

FIG. 12 is a conceptual side view illustrating the main structure of a high-frequency module. A high-frequency module 101B illustrated in FIG. 12 preferably has a so-called CSP (Chip Sized Package) structure.

The high-frequency module 101B includes a filter substrate 200. As described above, a filter electrode implementing the filter unit 21 and electrode patterns constituting connection conductors including the connection conductor 316 are provided on the filter substrate 200.

The high-frequency module 101B further includes a filter-mounting substrate 280. The filter-mounting substrate 280 includes, for example, an alumina substrates, and has an area larger than the filter substrate 200 by a predetermined amount, when viewed in plan.

The filter substrate 200 is mounted on the filter-mounting substrate 280 by bump conductors 281 so that the first principal surface of the filter substrate 200 is located facing the filter-mounting substrate 280. External connection bump conductors 282 are provided on a surface of the filter-mounting substrate 280 opposite to the surface on which the filter substrate 200 is mounted.

A circuit pattern, except the filter unit 21 of the high-frequency module 101B (with a circuit configuration identical to that of the high-frequency module 101), and the inductor 43L are provided on the filter-mounting substrate 280.

A mold resin 283 is applied to the surface of the filter-mounting substrate 280 on which the filter substrate 200 is mounted. This prevents the filter electrode and the electrode patterns constituting the connection conductors from being exposed to the external environment, and improves the resonance characteristics of a SAW resonator, resulting in an accurate implementation of the desired characteristics of a filter.

Here, the electrode pattern constituting the inductor 43L which is provided on the filter-mounting substrate 280 and the electrode pattern implementing the connection conductor 316 which is provided on the filter substrate 200 are arranged so as to at least partially overlap each other, when viewed in plan. This produces inductive coupling between the electrode pattern constituting the inductor 43L and the electrode pattern implementing the connection conductor 316, as illustrated in FIG. 12. In particular, the configuration of this preferred embodiment reduces the space (distance) between the electrode pattern constituting the inductor 43L and the electrode pattern implementing the connection conductor 316, resulting in stronger inductive coupling being implemented with ease.

In addition, since the high-frequency module 101B has a CSP structure as a whole, the high-frequency module 101B has a compact and low-profile design.

In the respective implementation structures described above, an example has been described in which an inductor is preferably used as a matching element. A matching element that is a capacitor can also be achieved with a similar structure. For example, in the first structure, a mount-type multi-layer capacitor element may be used. In the second structure, a capacitor may be implemented by a plurality of flat-plate electrodes provided in different layers of the multi-layer substrate 100 so as to face each other. Further, in the third structure, a capacitor may be implemented by an electrode pattern provided on the filter-mounting substrate 280.

Furthermore, as described above, it is sufficient that a connection conductor to be coupled to a matching element is configured such that one SAW resonator is interposed at least between the connection conductor and the matching element. As the number of SAW resonators interposed between them increases, the attenuation characteristics are more largely influenced. For example, in the first structure (see FIG. 9), if the positional relationship between the filter substrate 200 and the mount-type circuit element 430 is the same, the coupling of a matching element and a connection conductor between which a larger number of SAW resonators are interposed increase the influence on the attenuation characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency module comprising:
   a first external connection terminal;
   a second external connection terminal;
   a filter unit connected between the first external connection terminal and the second external connection terminal; and a matching element connected between at least one of the first external connection terminal or the second external connection terminal and the filter unit; wherein the filter unit includes:
- a first series connection terminal that connects to the first external connection terminal;
- a second series connection terminal that connects to the second external connection terminal;
- a plurality of shunt connection terminals that are each connected to ground;
- a plurality of series-connected filter elements connected in series with each other between the first series connection terminal and the second series connection terminal;
- a plurality of shunt-connected filter elements each including one end connected to a connection node of adjacent filter elements among the plurality of series-connected filter elements, and another end connected to one of the plurality of shunt connection terminals; and
- a plurality of connection units connected to the plurality of shunt-connected filter elements;

at least one of the plurality of shunt-connected filter elements is connected to each of the plurality of shunt connection terminals;

the plurality of connection units include:
- at least one first connection unit connected between one of the plurality of shunt-connected filter elements and the connection node; and
- at least one second connection unit connected between another one of the plurality of shunt-connected filter elements and a corresponding one of the plurality of shunt connection terminals, where only one of the plurality of shunt-connected filter elements is connected to the corresponding one of the plurality of shunt connection terminals; and the matching element is inductively coupled or capacitively coupled to at least one of the plurality of connection units.

2. The high-frequency module according to claim 1, wherein
at least one of the plurality connection units and the matching element are inductively coupled or capacitively coupled to each other so that an impedance outside a pass band of the filter unit changes.

3. The high-frequency module according to claim 2, wherein
at least one of the plurality of connection units and the matching element are inductively coupled or capacitively coupled to each other so that an attenuation pole frequency outside the pass band of the filter unit changes.

4. The high-frequency module according to claim 1, wherein the matching element is a series-connected matching element that is connected in series between the first external connection terminal and the first series connection terminal or that is connected in series between the second external connection terminal and the second series connection terminal.

5. The high-frequency module according to claim 1, wherein the matching element is a shunt-connected matching element that is connected between a connection path which connects the first external connection terminal and the first series connection terminal to each other and ground or that is connected between a connection path which connects the second external connection terminal and the second series connection terminal to each other and ground.

6. The high-frequency module according to claim 1, wherein the plurality of connection units includes a linear conductive pattern.

7. The high-frequency module according to claim 1, further comprising a third terminal and a second filter unit; wherein
the second filter unit is connected between a connection path which connects the first series connection terminal to the filter unit to be connected to the first series connection terminal and the third terminal.

8. The high-frequency module according to claim 1, further comprising:
- a flat-plate-shaped filter substrate including a first principal surface on which an IDT electrode of the filter unit and the plurality of connection units are provided;
- a flat-plate-shaped cover layer that faces the first principal surface of the filter substrate with a space between the cover layer and the first principal surface of the filter substrate;
- a further connection electrode having a shape that projects from the first principal surface and extends through the cover layer; and
- a multi-layer substrate including the matching element mounted thereon or formed therein; wherein the filter substrate is located so that the first principal surface is oriented toward a mounting surface of the multi-layer substrate; and
the filter substrate is connected to the multi-layer substrate via the connection electrode.

9. The high-frequency module according to claim 8, wherein
the matching element is a surface mount element to be mounted on the mounting surface of the multi-layer substrate;
the plurality of connection units are located on the first principal surface of the filter substrate near a first side of the filter substrate; and
the surface mount element is mounted near the first side of the filter substrate.

10. The high-frequency module according to claim 9, wherein the matching element includes:
- a rectangular or substantially rectangular parallelepiped housing; and
- a spiral conductor provided in the housing and having a rectangular or substantially rectangular outer peripheral shape in plan view; and
- the matching element is located so that a long side of the housing is parallel or substantially parallel to the first side of the filter substrate.

11. The high-frequency module according to claim 8, wherein
the matching element includes a conductive pattern provided on the mounting surface of the multi-layer substrate or a conductive pattern formed in the multi-layer substrate; and
the conductive pattern and the plurality of connection units at least partially overlap each other in plan view.

12. The high-frequency module according to claim 1, further comprising:
- a flat-plate-shaped filter substrate including a first principal surface on which an IDT electrode defining the filter unit and the plurality of connection units are provided; and
- a flat-plate-shaped filter-mounting substrate located on the first principal surface side of the filter substrate, the filter substrate being mounted to the filter-mounting substrate on the first principal surface; wherein the matching element is provided on the filter-mounting substrate.

13. The high-frequency module according to claim 1, wherein the plurality of filter elements include a plurality of surface acoustic wave resonators.

14. The high-frequency module according to claim 1, wherein each of the plurality of filter elements includes a band-pass characteristic.

15. The high-frequency module according to claim 1, wherein the matching element includes at least one of an inductor and a capacitor.

16. The high-frequency module according to claim 1, wherein the high-frequency module has combined transmission characteristics in which transmission characteristics of a main propagation path extending through the filter unit and transmission characteristics of a sub-propagation path extending through a further coupling unit are combined.

17. A duplexer comprising the high-frequency module according to claim 1.

18. The high-frequency module according to claim 1, wherein the filter unit has a wafer level package structure.

19. The high-frequency module according to claim 1, wherein the high-frequency module has a chip sized package structure.

\* \* \* \* \*